(12) United States Patent
Khusnatdinov et al.

(10) Patent No.: US 12,325,046 B2
(45) Date of Patent: Jun. 10, 2025

(54) SUPERSTRATE INCLUDING A BODY AND LAYERS AND METHODS OF FORMING AND USING THE SAME

(71) Applicant: CANON KABUSHIKI KAISHA, Tokyo (JP)

(72) Inventors: Niyaz Khusnatdinov, Round Rock, TX (US); Weijun Liu, Cedar Park, TX (US); James W. Irving, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 210 days.

(21) Appl. No.: 17/809,414

(22) Filed: Jun. 28, 2022

(65) Prior Publication Data

US 2023/0415195 A1    Dec. 28, 2023

(51) Int. Cl.
*B32B 7/022*   (2019.01)
*B05D 1/00*    (2006.01)
(Continued)

(52) U.S. Cl.
CPC ............... *B05D 1/36* (2013.01); *B05D 1/005* (2013.01); *B05D 1/38* (2013.01); *B05D 3/06* (2013.01);
(Continued)

(58) Field of Classification Search
None
See application file for complete search history.

(56) References Cited

U.S. PATENT DOCUMENTS 6,048,799 A  *  4/2000  Prybyla .................. B82Y 10/00
                                                       427/370
8,541,053 B2 *  9/2013  Menezes ............. H01L 21/3105
                                                       427/337
(Continued)

FOREIGN PATENT DOCUMENTS

GB        2397233 A  *  7/2004  ............. A61L 27/34
JP      2009149097 A     7/2009
(Continued)

OTHER PUBLICATIONS

Salvadori et al., DLC coating roughness as a function of film thickness, Apr. 2006, Surface and Coatings Technology, vol. 200, Issues 16-17, pp. 5119-5122 (Year: 2006).*
(Continued)

*Primary Examiner* — Jeffrey A Vonch
(74) *Attorney, Agent, or Firm* — Abel Schillinger, LLP

(57) ABSTRACT

A superstrate can include a body, a first layer, and a second layer, wherein the first layer is disposed between the body and the second layer. Each of the first and second layers has a proximal surface and a distal surface opposite the proximal surface, wherein the body is closer to the proximal surface than to the distal surface. An Ra of the distal surface of the second layer is less than an Ra of the distal surface of the first layer. In a method of making the superstrate, the relatively high Ra of the distal surface of the first layer may be related to the process or equipment used in forming the first layer. The second layer can be formed using another superstrate, where the Ra of the distal surface of the second layer is substantially the same as the contact surface of the other superstrate.

20 Claims, 5 Drawing Sheets

(51) Int. Cl.

| | | |
|---|---|---|
| B05D 1/36 | (2006.01) | |
| B05D 1/38 | (2006.01) | |
| B05D 3/06 | (2006.01) | |
| B05D 5/00 | (2006.01) | |
| B05D 5/08 | (2006.01) | |
| B32B 27/08 | (2006.01) | |
| B32B 27/30 | (2006.01) | |
| B32B 33/00 | (2006.01) | |
| G03F 7/00 | (2006.01) | |
| H01L 21/3105 | (2006.01) | |
| B05D 3/02 | (2006.01) | |
| B32B 27/06 | (2006.01) | |
| B82Y 40/00 | (2011.01) | |

(52) U.S. Cl.
CPC ............... *B05D 5/00* (2013.01); *B32B 7/022* (2019.01); *B32B 27/308* (2013.01); *B32B 33/00* (2013.01); *G03F 7/0002* (2013.01); *H01L 21/31058* (2013.01); *B05D 3/02* (2013.01); *B05D 3/067* (2013.01); *B05D 3/068* (2013.01); *B05D 5/08* (2013.01); *B05D 5/086* (2013.01); *B05D 2502/00* (2013.01); *B05D 2506/10* (2013.01); *B32B 27/06* (2013.01); *B32B 27/08* (2013.01); *B32B 2255/24* (2013.01); *B32B 2255/26* (2013.01); *B32B 2255/28* (2013.01); *B32B 2305/72* (2013.01); *B32B 2305/77* (2013.01); *B32B 2307/538* (2013.01); *B32B 2307/7376* (2023.05); *B32B 2307/748* (2013.01); *B32B 2310/0837* (2013.01); *B32B 2333/04* (2013.01); *B32B 2333/08* (2013.01); *B32B 2333/12* (2013.01); *B82Y 40/00* (2013.01); *H01L 21/31051* (2013.01); *Y10T 428/24355* (2015.01); *Y10T 428/24364* (2015.01); *Y10T 428/24942* (2015.01); *Y10T 428/265* (2015.01); *Y10T 428/269* (2015.01); *Y10T 428/31* (2015.01)

(56) References Cited

U.S. PATENT DOCUMENTS

| | | | |
|---|---|---|---|
| 10,580,659 B2 | 3/2020 | Khusnatdinov et al. | |
| 10,892,167 B2 | 1/2021 | De Young et al. | |
| 11,126,083 B2 | 9/2021 | Resnick et al. | |
| 2005/0026454 A1* | 2/2005 | Konishi | H01L 21/76829 438/778 |
| 2006/0003600 A1* | 1/2006 | Barns | H01L 21/76819 257/E21.243 |
| 2007/0017631 A1* | 1/2007 | Xu | B82Y 10/00 156/272.2 |
| 2007/0212494 A1* | 9/2007 | Xu | B82Y 10/00 427/401 |
| 2009/0123590 A1* | 5/2009 | Komoriya | B82Y 10/00 425/174.4 |
| 2009/0138077 A1* | 5/2009 | Weber | A61L 31/088 428/210 |
| 2009/0155583 A1* | 6/2009 | Xu | G03F 7/0388 428/336 |
| 2010/0012622 A1* | 1/2010 | Panga | G03F 7/70483 216/52 |
| 2010/0084376 A1* | 4/2010 | Khusnatdinov | B82Y 10/00 264/430 |
| 2010/0104852 A1* | 4/2010 | Fletcher | G03F 7/0002 428/338 |
| 2010/0109195 A1 | 5/2010 | Xu et al. | |
| 2010/0109201 A1* | 5/2010 | Fletcher | G03F 7/0002 216/11 |
| 2010/0112236 A1* | 5/2010 | Fletcher | B82Y 40/00 427/207.1 |
| 2010/0173247 A1* | 7/2010 | Burns | G03F 7/027 430/281.1 |
| 2010/0177398 A1* | 7/2010 | Watanabe | G02B 5/0221 216/11 |
| 2011/0236600 A1* | 9/2011 | Fox | C23C 16/4401 427/579 |
| 2012/0007276 A1* | 1/2012 | Kobayashi | B29C 33/305 264/293 |
| 2012/0009413 A1* | 1/2012 | Menezes | B82Y 10/00 438/692 |
| 2012/0064290 A1* | 3/2012 | Esat | A61L 27/34 428/161 |
| 2012/0073462 A1 | 3/2012 | Imhof et al. | |
| 2014/0268080 A1* | 9/2014 | Beasley | G03F 1/24 430/5 |
| 2014/0273509 A1* | 9/2014 | Wang | H01L 21/6715 118/712 |
| 2015/0048050 A1* | 2/2015 | Sreenivasan | B05D 5/00 427/508 |
| 2016/0318066 A1* | 11/2016 | Sreenivasan | B81C 1/00373 |
| 2017/0106399 A1* | 4/2017 | Sreenivasan | B29D 11/00865 |
| 2017/0333940 A1* | 11/2017 | Sreenivasan | B41J 2/01 |
| 2019/0051518 A1* | 2/2019 | Shigaki | C09D 183/04 |
| 2019/0080922 A1* | 3/2019 | Khusnatdinov | H01L 21/02345 |
| 2019/0227437 A1* | 7/2019 | Resnick | C03C 17/225 |
| 2020/0142299 A1* | 5/2020 | Norikane | G03F 7/0002 |
| 2021/0165317 A1* | 6/2021 | Tan | G03F 7/0002 |
| 2021/0294148 A1* | 9/2021 | Grzeskowiak | G03F 7/094 |
| 2021/0296121 A1* | 9/2021 | Schepis | H01L 21/0274 |
| 2021/0305082 A1* | 9/2021 | Wan | H01L 21/76804 |
| 2022/0013417 A1* | 1/2022 | Sreenivasan | G03F 7/0002 |

FOREIGN PATENT DOCUMENTS

| | | | | |
|---|---|---|---|---|
| JP | 2013211450 A | 10/2013 | | |
| JP | 2014138154 A | 7/2014 | | |
| KR | 100342575 B | 7/2002 | | |
| WO | WO-2014199991 A1 * | 12/2014 | | B32B 9/00 |
| WO | WO-2018051961 A1 * | 3/2018 | | B29C 59/02 |
| WO | WO-2019177742 A1 * | 9/2019 | | H01L 21/56 |

OTHER PUBLICATIONS

Machine Translation of JP2009149097A, Jul. 2009 (Year: 2009).*
Machine Translation of WO2018051961A1, Mar. 2018 (Year: 2018).*
White et al., Topography-induced thickness variation anomalies for spin-coated thin films, May 1985, Journal of Vacuum Science & Technology B: Microelectronics Processing and Phenomena, vol. 3, pp. 862-868 (Year: 1985).*
Bornside, Mechanism for the Local Planarization of Microscopically Rough Surfaces by Drying Thin Films of Spin-Coated Polymer/Solvent Solutions, Aug. 1990, Journal of the Electrochemical Society, vol. 137, p. 2589 (Year: 1990).*
Solomon et al., Correlation of structural and optical properties of PVD grown amorphous carbon thin films, May 2017, Diamond and Related Materials, vol. 75, pp. 69-77 (Year: 2017).*
Singhal et al., Development of an inkjet-enabled adaptive planarization process, Oct. 2017, Photomask Technology 2017, Proceedings vol. 10451, p. 104511A (Year: 2017).*
Singhal et al., Inkjet-based adaptive planarization (Conference Video Presentation Transcription), May 2017, Advances in Patterning Materials and Processes XXXIV, Proceedings vol. 10146, p. 1014619 (Year: 2017).*
Ke et al., Planarized spin-on carbon hardmask, Mar. 2020, Advances in Patterning Materials and Processes XXXVII, Proceedings vol. 11326, p. 1132617 (Year: 2020).*

* cited by examiner

SUPERSTRATE INCLUDING A BODY AND LAYERS AND METHODS OF FORMING AND USING THE SAME

FIELD OF THE DISCLOSURE

The present disclosure relates to superstrates including a body and layers and methods of making and using the superstrates.

RELATED ART

A superstrate can be used in ink-jet-based adaptive planarization. A superstrate can include a body and a layer over the body, where a contacting surface of the superstrate lies along an exposed surface of the layer. In theory, a superstrate used in forming a planarized layer should have a perfectly planar contact surface. In practice, a perfectly planar contact surface cannot be achieved. Further improvements in the planarity of the contact surface of a superstrate are desired.

SUMMARY

In an aspect, a superstrate can include a body of a superstrate, a first layer, and a second layer. The first layer has a proximal surface and a distal surface opposite the proximal surface, wherein the body can be closer to the proximal surface of the first layer than to the distal surface of the first layer. The second layer has a proximal surface and a distal surface opposite the proximal surface, wherein the body can be closer to the proximal surface of the second layer than to the distal surface of the second layer. The first layer can be disposed between the body and the second layer, and an Ra of the distal surface of the second layer can be less than an Ra of the distal surface of the first layer, wherein the Ra is an arithmetic average surface roughness.

In an embodiment, the superstrate further includes a third layer, wherein the third layer is disposed between the first layer and the second layer.

In another embodiment, the third layer has a proximal surface and a distal surface opposite the proximal surface, wherein the body is closer to the proximal surface of the third layer than to the distal surface of the third layer, and an Ra of the distal surface of the third layer is less than the Ra of the distal surface of the first layer.

In a particular embodiment, the third layer includes a polymerizable compound.

In still another embodiment, the second layer includes an oxide, a nitride, an oxynitride, or a fluoropolymer.

In yet another embodiment, the first layer includes spin-on carbon, a polymer, a chemical or physical vapor deposited carbon film.

In a further embodiment, along the distal surface of the first layer, the first layer does not have an intentional pattern of recessions and protrusions.

In another embodiment, the Ra of the distal surface of the second layer is at most 0.20 nm.

In a further embodiment, a nanotopography of the distal surface of the second layer is less than a nanotopography of the distal surface of the first layer.

In a particular embodiment, a nanotopography of the distal surface of the second layer is at most 5.9 nm on a 2 mm lateral scale.

In another aspect, a method of making a first superstrate can include forming a first layer along a surface of a body of a first superstrate, wherein the first layer has a proximal surface and a distal surface opposite the proximal surface, and the body is closer to the proximal surface of the first layer than to the distal surface of first layer. The method can further include forming a second layer along the distal surface of the first layer, wherein the second layer has a proximal surface and a distal surface opposite the proximal surface, and the body is closer to the proximal surface of the second layer than to the distal surface of second layer. An Ra of the distal surface of the second layer can be less than an Ra of the distal surface of the first layer, wherein the Ra is an arithmetic average surface roughness.

In an embodiment, forming the second layer includes depositing a precursor for the second layer over the first layer; contacting the precursor with a second superstrate; and curing the precursor to form the second layer, wherein the second superstrate contacts the precursor during curing.

In another embodiment, forming the second layer includes depositing a precursor for the second layer along a surface of a second superstrate; contacting the precursor with the first layer; and curing the precursor to form the second layer, wherein the second superstrate contacts the precursor during curing.

In still another embodiment, forming the first layer includes depositing a precursor for the first layer along the surface of the body, wherein the precursor has an exposed surface opposite the body; and curing the precursor using curing energy to form the first layer, wherein during curing, a solid object is not in contact with the exposed surface of the precursor.

In yet another embodiment, forming the first layer includes depositing a precursor for the first layer along the surface of the body; and curing the precursor using curing energy to form the first layer, wherein during curing, the precursor is not uniformly exposed to the curing energy.

In a further embodiment, the first superstrate has an ultraviolet transmittance of at least 70%, and the second superstrate is a silicon wafer.

In another embodiment, the method of claim 11 further includes forming a third layer along the distal surface of the second layer, wherein the third layer has a proximal surface and a distal surface opposite the proximal surface, the body is closer to the proximal surface of the third layer than to the distal surface of third layer, and an Ra of the distal surface of the third layer is less than the Ra of the distal surface of the first layer.

In a particular embodiment, the Ra of the distal surface of the third layer is at most 0.20 micron.

In a further aspect, a method of making an article can include dispensing a formable material over a patterned layer of a workpiece, wherein the workpiece includes a substrate and the patterned layer overlies the substrate; contacting the formable material with the superstrate of claim 1; exposing the formable material to actinic radiation to form a planarization layer while the distal surface of the second layer of the superstrate is in contact with the formable material to form a planarization layer; and processing the workpiece to complete formation of the article.

In an embodiment, the superstrate further includes a third layer. The third layer is disposed between the first layer and the second layer, and the third layer has a proximal surface and a distal surface opposite the proximal surface, wherein the body is closer to the proximal surface of the third layer than to the distal surface of third layer. An Ra of the distal surface of the third layer is less than the Ra of the distal surface of the first layer.

BRIEF DESCRIPTION OF THE DRAWINGS

Implementations are illustrated by way of example and are not limited in the accompanying figures.

Figure 1:
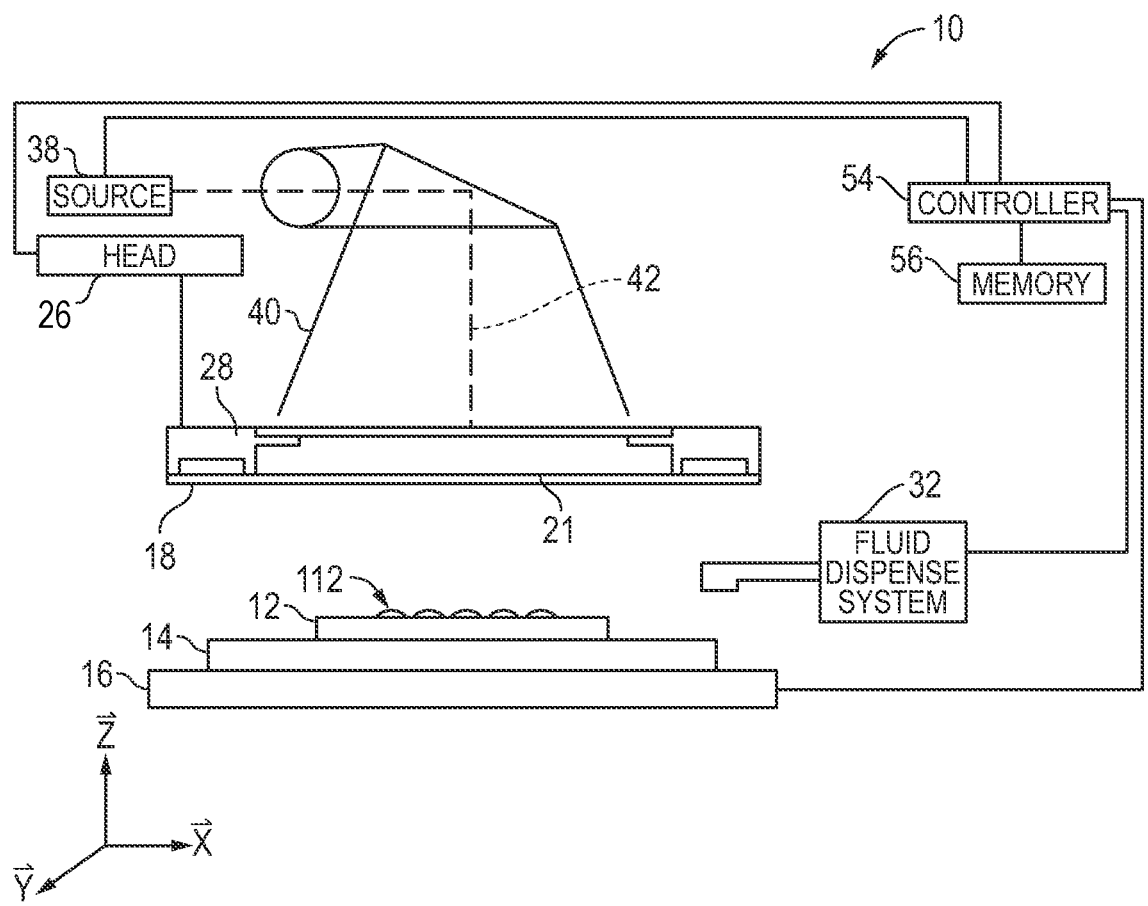
FIG. 1 includes an illustration of a side view of an apparatus in accordance with an implementation, wherein the apparatus includes a superstrate.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations and implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

Microelectronic device fabricators are designing physical structures with smaller dimensions on substrates with large diameters. The smaller dimensions and larger substrates increase the challenges to microelectronic equipment manufactures in making equipment to meet the expectations of the microelectronic device fabricators. Many skilled artisans assume the surface roughness and the nanotopography of a contact surface of a superstrate is substantially the same as the surface roughness and nanotopography of the surface of a body of a superstrate. For example, a superstrate can include a body and one or more layers over the body. The body has a surface in contact with a layer of the one or more layers. The body can be made of a glass-based material, and the surface of the body has an arithmetical average surface roughness, Ra, of 0.16 nm and a nanotopography of 3.8 nm on 2 mm lateral scale. The surface of the body has acceptable surface roughness and nanotopography. The contact surface of superstrate is a distal surface of a layer of the one or more layers. Skilled artisans assumed that the contact surface of the superstrate, which is the distal surface of the layer, has acceptable surface roughness and nanotopography because the surface of the body has acceptable surface roughness and nanotopography.

The inventors discovered that an assumption that the contact surface of the superstrate has substantially the same surface roughness and nanotopography of the surface of the body of the superstrate is many times incorrect. A layer formed along a surface of the body has a proximal surface and a distal surface opposite, where the proximal surface is closer to the body, and the distal surface is opposite the proximal surface. The distal surface of the layer has significantly worse surface roughness and nanotopography as compared to the surface of the body. When the buffer layer is polymethylmethacrylate (PMMA) and formed using a spin coating and thermal curing process, the distal surface of the buffer layer can have an Ra of 0.33 nm and a nanotopography in the range of 6 nm to 8 nm on 2 mm lateral scale. A protective layer that is formed along the distal surface of the buffer layer, where the distal surface of the protective layer can be the contact surface of the superstrate. The distal surface of the protective layer has substantially the same Ra and nanotopography as the distal surface of the buffer layer and may sometimes have a slightly larger Ra for example 0.4 nm when the PMMA has an Ra of 0.3 nm. A distal surface of the protective layer has substantially surface roughness and nanotopography of the distal surface of the buffer layer. Therefore, the distal surface of the protective layer has significantly worse surface roughness and nanotopography as compared to the surface of the body of the superstrate.

To reduce problems with poor surface roughness and nanotopography along the contact surface of the superstrate, another layer can be formed over the relatively rougher, less flat surface of an underlying layer to improve the surface roughness, nanotopography, or both surface roughness and nanotopography of an exposed surface of the superstrate. For example, a buffer layer can be formed over a body of a superstrate. The buffer layer has a proximal surface and a distal surface, where the proximal surface is closer to the body, and the distal surface is opposite the proximal surface. The distal surface of the buffer layer has significantly worse surface roughness and nanotopography than a surface of the body. A compensation layer can be formed over the buffer layer. The compensation layer has a proximal surface and a distal surface, where the proximal surface is closer to the buffer layer, and the distal surface is opposite the proximal surface. The distal surface of the compensation layer has a surface roughness, a nanotopography, or both surface roughness and nanotopography that is significantly better than the surface roughness and nanotopography of the distal surface of the buffer layer. The distal surface of the compensation layer has a surface roughness and nanotopography that is substantially the same or even better than the surface roughness and nanotopography of the surface of the body of the superstrate. For example, the distal surface of the compensation layer can have an Ra of 0.08 nm and a nanotopography of 3.0 nm on 2 mm lateral scale. Novel superstrates and methods of making and using the superstrates are described in more detail below.

Referring to FIG. 1, an apparatus 10 can be used to aid in shaping a layer including a liquid precursor over a substrate 12. The substrate 12 can be coupled to a substrate chuck 14. As illustrated, the substrate chuck 14 is a vacuum chuck; however, in other implementations the substrate chuck 14 can be any chuck including vacuum, pin-type, groove-type, electrostatic, electromagnetic, or the like. The substrate 12 and substrate chuck 14 can be further supported by a stage 16. The stage 16 can provide translating or rotational motion along the X-, Y-, or Z-directions.

Spaced-apart from the substrate 12 is a superstrate 18 that can be used in forming a planarization layer over the substrate 12. More details regarding the superstrate 18 are described later in this specification. The superstrate 18 can be coupled to a superstrate chuck 28. The superstrate chuck 28 can be configured as vacuum, pin-type, groove-type, electrostatic, electromagnetic, or another similar chuck type. In an implementation, the superstrate chuck 28 can be coupled to a head 26 such that the superstrate chuck 28 or the head 26 can facilitate movement of the superstrate 18.

The apparatus 10 can further include a fluid dispense system 32 used to deposit a formable material 112 on the substrate 12. For example, the formable material 112 can include a polymerizable material, such as a photoresist (which may be a mixture of a monomer and other components such as a photoinitiator, or a thermal-initiator). The formable material 112 can be positioned on the substrate 12 and formed using a technique, such as droplet dispense, spin-coating, dip coating, extrusion coating, or a combination thereof. The formable material 112 can be dispensed upon the substrate 12 before or after a desired volume is defined between a superstrate 18 and the substrate 12, depending on design considerations. For example, the formable material 112 can include a monomer mixture that can be cured using ultraviolet light, heat, or the like.

The apparatus 10 can further include an energy source 38 where energy from the energy source 38 is directed along a path 42 within a zone 40. The head 26 and the stage 16 can be configured to position the superstrate 18 and the substrate 12 in superimposition with the path 42. The superstrate 18 includes a membrane portion 21 through which energy from the energy source 38 can be transmitted. The apparatus 10 can be regulated by a controller 54 in communication with the stage 16, the head 26, the fluid dispense system 32, or the energy source 38, and can operate on a computer readable program, optionally stored in memory 56. The controller 54 can include a processor (for example, a central processing unit of a microprocessor or microcontroller), a field-programmable gate array (FPGA), an application specific integrated circuit (ASIC), or the like. The controller 54 can be within the apparatus. In another implementation (not illustrated), the controller 54 can be at least part of a computer external to the apparatus 10, where such computer is bidirectionally coupled to the apparatus 10.

Figure 2:
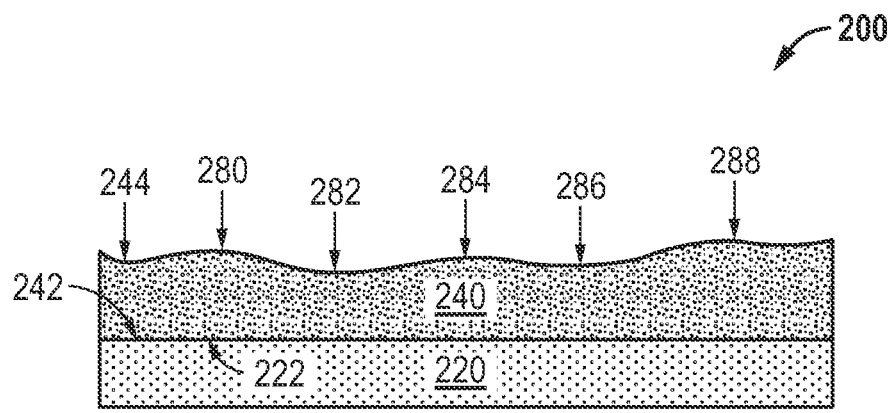
FIG. 2 includes an illustration of a cross-sectional view of a workpiece after forming a buffer layer along a surface of a body of the superstrate.

Attention is directed to a method of making the superstrate 18. The method can include forming a buffer layer 240 along a surface 222 of a body 220 of a workpiece 200, as illustrated in FIG. 2. The buffer layer 240 has a proximal surface 242 and a distal surface 244 opposite the proximal surface 242.

The body 220 provides mechanical support for the workpiece 200. The body 220 has a transmittance of at least 70%, at least 80%, at least 85%, or at least 90% for actinic radiation used to cure the formable material 112 (in FIG. 1). The body 220 can include a glass-based material, silicon, an organic polymer, a siloxane polymer, a fluorocarbon polymer, a sapphire, a spinel, another similar material, or any combination thereof. The glass-based material can include soda lime glass, borosilicate glass, alkali-barium silicate glass, aluminosilicate glass, quartz, synthetic fused-silica, or the like. The selection of the material for the body 220 may depend on the type of energy used to cure the formable material 112. In an embodiment, the energy can be ultraviolet radiation, and the body 220 has an ultraviolet transmittance of at least 70%. In such an embodiment, a glass-based material can be used for the body 220. The body 220 can have a thickness in a range from 30 microns to 2000 microns.

The surface 222 of the body 220 can have an area that is at least 90% of the area of the substrate 12 and may have area that is the same or larger than the substrate 12. In an embodiment, the surface area is at least 110 cm$^2$, at least 300 cm$^2$, at least 700 cm$^2$, or larger, and in the same or another embodiment, the surface area may be at most 32,000 cm$^2$. In terms of ranges, the surface area can be in a range from 110 cm$^2$ to 22,000 cm$^2$, 300 cm$^2$ to 9000 cm$^2$, or 800 cm$^2$ to 1300 cm$^2$.

The surface 222 of the body has a two-dimensional shape including a circle, an ellipse, a rectangle (including a square), a hexagon, or the like. The surface 222 is substantially planar and does not have recessions and protrusions and can be referred to as a blank. The surface 222 can have an Ra that is determined by Atomic Force Microscope (AFM). An area of 3 microns×0.75 micron with measurement of 512 points×128 points was used to determine Ra according to SEMI M40 standard. The surface 222 can have a nanotopography that can be determined by using Large Area_Zygo Verifire interferometer tool, or New View Zygo interferometer tool (available from Zygo Corporation, Middlefield, CT). The measurement settings were: measurement wavelength of 632.8 nm; measurement type was surface; measurement mode was coherence scanning interferometry; fringe removal was on; the FDA Resolution was High 2G; the scan length was 20 micrometers; for the large area Zygo and Verifire the fields of view were up to 50 mm×50 mm; for the New View Zygo the field of view was up to 8.38 mm×8.38 mm. According to SEMI standard M49, the nanotopography is measured as a peak-valley (PV) value on a 2 mm lateral scale. We used 9 to 144 locations along the body surface with 2 mm diameter analysis areas to determine the nanotopography. For surface roughness, AFM is used with an edge exclusion of 3 mm from the edge of the superstrate, as measurements may not be accurate when they are taken too close to the edge of the superstrate 18. The same is valid for nanotopography measurements. All 9 to 144 locations for nanotopography measurements are located outside of the exclusion area. In an embodiment, Ra of the surface 222 of the body 220 can be at most 0.20 nm or, more specifically, in a range from 0.04 nm to 0.20 nm. In the same or further embodiment, nanotopography of the surface 222 of the body 220 can be at most 5.9 nm or, more specifically, in a range from 1.7 nm to 5.9 nm or 2.0 nm to 4.0 nm, all on a 2 mm lateral scale. In an embodiment where the body 220 is made of synthetic fused silica, the surface 222 can have an Ra of 0.16 nm and a nanotopography 3.8 nm on a 2 mm lateral scale.

The buffer layer 240 can help to reduce the likelihood of a particle reaching the body 220 of the workpiece 200, where the particle could scratch the surface 222 of the body 220 if the particle reached the surface 222. The buffer layer 240 can be formed over the surface 222 of the body 220. The buffer layer 240 has a different composition as compared to the body 220. Accordingly, the buffer layer 240 can be selectively removed as compared to the body 220.

The buffer layer 240 can have a relatively low Young's modulus as compared to the body 220 and include an organic compound. In an embodiment, the buffer layer 240 includes spin-on carbon, a polymer, a chemical or physical vapor deposited carbon film, or the like. In a particular embodiment, the buffer layer 240 can include an acrylic polymer, such as PMMA. The buffer layer 240 can be formed by coating a precursor and curing the precursor using curing energy. The curing energy can be ultraviolet, light, or infrared radiation, or heat. During curing, a solid object is not in contact with the exposed surface of the precursor. The buffer layer 240 can be coated and cured on the same chuck or may be coated on a coater chuck and cured on a separate chuck.

The inventors have discovered that the distal surface 244 of the buffer layer 240 has an Ra and nanotopography that are significantly worse than the Ra and nanotopography of the surface 222 of the body 220 of the superstrate 18. Locations 280, 282, 284, 286, and 288 along the distal surface 244 can lie at different elevations over the surface 222 of the body 220. Ra along the distal surface 244 of the buffer layer 240 can be 0.32 nm, and a nanotopography along the distal surface 244 of the buffer layer 240 can be in the range from 6 nm to 8 nm on 2 mm lateral scale. The roughness Ra was measured with an Icon Dimension with ScanAsyst AFM available from Bruker of Billerica, MA with the following settings: Stylus was a D-TESPA-V2, coated with diamond like carbon (DLC) material; tip height was 10 microns to 15 microns with a front angle of 25°, a back angle of 17.5°, and a side angle of 20°; tip radius was 7 nm to 10 nm; spring constant was 0.4 Newtons per meter; sampling interval was 5.86 nm; ScanAsyst noise threshold was set at 0.5 nm; evaluation area was 3 micron×0.75 micron; and a 2nd order flattening operation was performed to separate the nanotopography from the roughness.

Although not to be bound by theory, the inventors believe the poor surface roughness and nanotopography along the distal surface 244 of the buffer layer 240 is likely related to the equipment used in forming the buffer layer 240, the process of forming the buffer layer 240, or both the equipment and the process. During curing, the precursor being cured to form the buffer layer 240 may receive nonuniform curing energy along the surface 222 of the body 220 of the superstrate 240. The distal surface 244 of the buffer layer 240 may show a signature corresponding to the chuck used when forming the buffer layer 240 in view of variation in the thickness of buffer layer 240. The variation in thickness may be caused by uneven evaporation of a solvent due to uneven temperature distribution along the body 220 when the buffer layer 240 is cured by heat. Another mechanism may at least in part cause the variation in thickness of the buffer layer 240. A compensation layer can be formed over the buffer layer 240 to counter the effects of the elevational changes along the distal surface 244 of the buffer layer 240.

Figure 3:
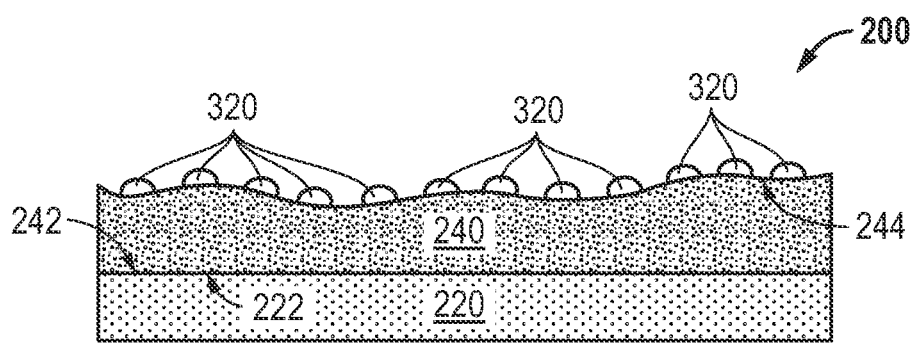
FIG. 3 includes an illustration of a cross-sectional view of the workpiece of FIG. 2 after dispensing a precursor over the buffer layer.

In a non-limiting embodiment, the compensation layer can be formed using an Inkjet-based Adaptive Planarization (IAP) technique. The method can include dispensing a precursor material 320 over the distal surface 244 of the buffer layer 240 as illustrated in FIG. 3. The precursor material 320 can include a polymerizable compound and a photopolymerization initiator. In a particular embodiment, the precursor material can include an acrylic compound. The precursor material 320 may or may not include a non-polymerizable compound or a solvent. The non-polymerizable compound can include one or more of a sensitizer, a hydrogen donor, an internal release agent (for example, a surfactant), an antioxidant, or a combination thereof. The precursor material 320 may or may not include a surfactant. The surfactant can include nonionic fluorinated compounds such as the release agents Capstone FS-3100, FC-4432 (3M), S-222N and S-554-100 from Chemguard, Megaface DIC surfactants (F444, F470, F552, F554, F557, F563, etc.) and fluoroether compounds. The surfactant can also include non-fluorinated surfactants such as Si containing compounds and hydrocarbon surfactants. When a precursor material is used during the fabrication of a semiconductor device, such precursor material may include 1 wt. % to 2 wt. % of the surfactant. The precursor material 320 may include the same content of surfactant as compared to a precursor material used when forming a planarization layer in the fabrication of a microelectronic device. In another embodiment, the precursor material 320 does not include a surfactant or includes at most 100 ppm of the surfactant.

The precursor material 320 can be dispensed as droplets. Although the precursor material 320 is illustrated in FIG. 3 as substantially equal volume droplets with substantially equal spacing, in practice, the dispensing of the precursor material 320 can be tailored to distal surface 244 of the buffer layer 240. For example, a locally higher areal density of droplets may be formed at a location where the distal surface 244 of the buffer layer 240 is at a relatively lower elevation (for example, locations 282 and 284 in FIG. 2), and a locally lower areal density of droplets may be formed at a location where the elevation of the distal surface 244 of the buffer layer 240 is relatively higher elevation (for example, locations 280, 286, and 288 in FIG. 2). The total volume of precursor material 320 can be at least an amount sufficient such that an effective thickness of the precursor material 320 (the total volume of precursor material 320 dispensed divided by an area of the surface 222 of the body 220) is at least twice the value for Ra corresponding to the distal surface 244 of the buffer layer 240 plus an overburden thickness of the precursor material. In a typical embodiment, the overburden thickness is in a range from 3 nm to 100 nm, while the Ra is typically less than 1 nm. Thus, it is only in extreme cases with high roughness that the Ra has an impact on the amount of precursor material 320 that is used. For example, if Ra for the distal surface 244 is 0.32 nm, then the effective thickness of the precursor material 320 is at least 0.32 nm. Alternatively, the effective thickness of the precursor material 320 is at least the value for the nanotopography corresponding to the distal surface 244 of the buffer layer 240. For example, if nanotopography for the distal surface 244 is 8 nm, then the effective thickness of the precursor material 320 is at least 8 nm. The total volume of the precursor material 320 should be at least enough to ensure that a different superstrate used in forming the compensation layer does not contact the buffer layer 240.

Figure 4:
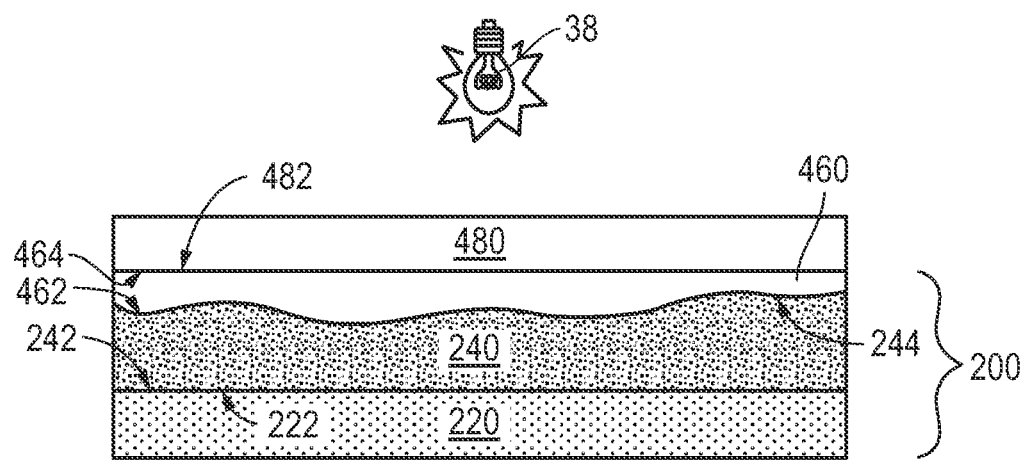
FIG. 4 includes an illustration of a cross-sectional view of the workpiece of FIG. 3 during curing of the precursor to form a compensation layer.

Referring to FIGS. 3 and 4, the method can further include contacting the precursor material 320 with a superstrate 480 and curing the precursor material 320 to form a compensation layer 460 from the precursor material 320. In an embodiment, the radiation source 38 can be used to generate radiation to cure the precursor material 320. The superstrate 480 is different from the superstrate 18 that is being fabricated from the workpiece 200. The superstrate 480 can include any of the materials as previously described with respect to the body 220. The superstrate 480 can have the same composition or a different composition as compared to the body 220. The areal relationship and area of a contacting surface 482 of the superstrate 480 can have the same or a different composition as compared to the body 220 and the body's areal relationship to the substrate 12. The superstrate 480 has a transmittance of at least 70%, at least 80%, at least 85%, or at least 90% for radiation used to cure a precursor material 320. In a particular embodiment, ultraviolet radiation can be used to cure the precursor material 320, and the superstrate 480 can be made of a glass-based material.

The contact surface 482 of the superstrate 480 can have an Ra, a nanotopography, or both an Ra and nanotopography that is better as compared to the distal surface 244 of the buffer layer 240. The contact surface 482 of the superstrate 480 can have any of the values for Ra and nanotopography as previously described with respect to the surface 222 of the body 220. The contact surface 482 of the superstrate 480 can have the same value or a different value of Ra as compared to the surface 222 of the body 220. The contact surface 482 of the superstrate 480 can have the same value or a different value of nanotopography as compared to the surface 222 of the body 220. When the superstrate 480 is made of synthetic fused-silica, the contact surface 482 can have an Ra of 0.16 nm and a nanotopography of 3.8 nm on a 2 mm lateral scale.

As the distance between the superstrate 480 and the superstrate 18 is decreased, the precursor material 320 contacts the contact surface 482 of the superstrate 480. Droplets of the precursor material 320 coalesce to form a continuous film over the distal surface 244 of the buffer layer 240. The precursor material 320 is cured by curing energy to form a compensation layer 460 having a proximal surface 462 and a distal surface 464 opposite the surface 462. The manufacturer of the precursor material 320 provides information on the particular type of energy that is to be used with the precursor material 320. The curing energy can include heat or actinic radiation having a wavelength in a range from 10 nm to 1000 nm. In an embodiment, actinic radiation can be ultraviolet light, visible light, or infrared radiation. The compensation layer 460 can be a polymer, for example, a polyacrylate.

Figure 5:
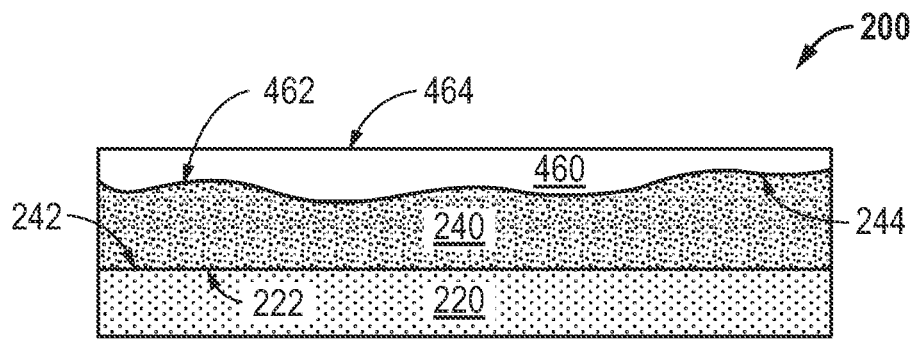
FIG. 5 includes an illustration of a cross-sectional view of the workpiece of FIG. 4 after removing a planarizing superstrate used when forming the compensation layer.

The thickness of the compensation layer 460 is sufficient to fill locations at lower elevations along the distal surface 244 of the buffer layer 240. The compensation layer 460 can have a thickness of at least 0.3 nm, at least 1.1 nm, or at least 20 nm. In the same or another embodiment, the thickness may be at most 2000 nm. With respect to ranges, the compensation layer 460 can have a thickness in a range from 0.3 nm to 2000 nm, 1.1 nm to 950 nm, or 20 nm to 500 nm. After forming the compensation layer 460, the superstrate 480 is removed as illustrated in FIG. 5.

The distal surface 464 of the compensation layer 460 can have substantially the same Ra, nanotopography, or both Ra and nanotopography as the contact surface 482 of the superstrate 480. In an embodiment, Ra of the distal surface 464 of the compensation layer 460 can be at most 0.20 nm or, more specifically, in a range from 0.04 nm to 0.20 nm, and in the same or different embodiment, nanotopography of the distal surface 464 of the compensation layer 460 can be at most 5.9 nm or, more specifically, in a range from 1.7 nm to 5.9 nm or 2.0 nm to 4.0 nm, all on a 2 mm lateral scale.

Figure 6:
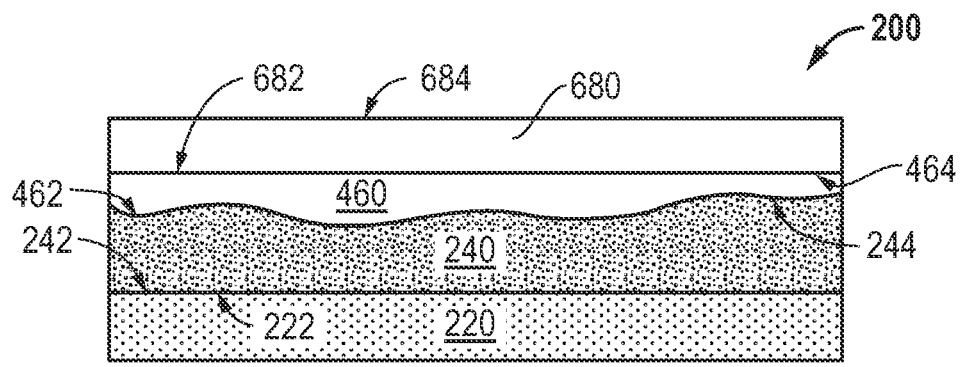
FIG. 6 includes an illustration of a cross-sectional view of the workpiece of FIG. 5 after forming a protective layer over the compensation layer.

A protective layer 680 is formed along the distal surface 464 of the compensation layer 460 as illustrated in FIG. 6. The protective layer has a proximal surface 682 and a distal surface 684 opposite the proximal surface 682. The protective layer 680 can include an oxide, a nitride, an oxynitride, a fluoropolymer, or the like. In a particular embodiment, the protective layer 680 includes silicon dioxide, an aluminum oxide, an amorphous fluoropolymer, or the like. In an embodiment, the fluoropolymer can include a perfluororodioxole tetrafluoroethylene copolymer. In the same or different embodiment, the fluoropolymer can include a dioxolane ring. U.S. Pat. No. 10,892,167 is incorporated herein by reference with respect to fluoropolymers described regarding layer 210 in such patent. In a particular embodiment, the fluoropolymer is Cytop®-brand fluoropolymer available from AGC Chemicals Americas, Inc. of Exton, Pennsylvania, USA.

Depending on the material selected for the protective layer 680, the protective layer 680 can be formed by chemical vapor deposited (with or without plasma assistance), atomic layer deposition, physical vapor deposition (for example, sputtering), spin coating, or the like.

The protective layer 680 can have a thickness of at least 11 nm, at least 50 nm, or at least 200 nm, and in the same or another embodiment, the thickness is at most 10000 nm, at most 3000 nm, or at most 950 nm. With respect to ranges, the protective layer 680 can have a thickness in a range from 11 nm to 10000 nm, 50 nm to 3000 nm, or 200 nm to 950 nm.

Either or both of the surfaces 682 and 684 of the protective layer 680 can have an Ra and nanotopography that is substantially the same as the distal surface 464 of the compensation layer 460. In an embodiment, Ra for each of the surfaces 682 and 684 of the protective layer 680 can be in a range from 0.04 nm to 0.20 nm. In the same or further embodiment, nanotopography of the surfaces 682 and 684 of the protective layer 680 can be at most 5.9 nm or, more specifically, in a range from 1.7 nm to 5.9 nm or from 2.0 nm to 4.0 nm, all on a 2 mm lateral scale.

The protective layer 680 can be treated with a release compound (not illustrated) to facilitate release of the superstrate 18 from a planarization layer formed using the superstrate 18. In an embodiment, exemplary release compounds are described in US Patent Publication No. 2010/0109195, which is incorporated herein by reference for its teachings regarding release compounds. The release compound does not significantly add to the thickness of the protective layer 680, for example, less than 10 nm. The release compound does not significantly affect Ra and nanotopography of the contact surface of the superstrate 18.

The buffer layer 240, the compensation layer 460, and the protective layer 680 may be permeable to a process gas. The permeability can help to remove gas that may otherwise be trapped when the superstrate 18 contacts a planarization precursor material. The buffer layer 240, the compensation layer 460, protective layer 680, or any or all are more permeable to the process gas as compared to the body 220. In an embodiment, the process gas is helium.

The workpiece 200 at this point in the process is the substantially completed superstrate 18. The distal surface 684 of the protective layer 680 or an exposed surface of the release compound, if a release compound is used, is the contact surface for the superstrate 18. The contact surface of the superstrate 18 can have an Ra of at most 0.20 nm or, more specifically, in a range of 0.04 nm to 0.20 nm and a nanotopography of at most 5.9 nm or, more specifically, in a range of 1.7 nm to 5.9 nm or 2.0 nm to 4.0 nm, all on a 2 mm lateral scale.

Another method of making the superstrate 18 is described with respect to FIGS. 2 and 7 to 9. In this embodiment, the precursor material 320 is formed along a contact surface of a different superstrate (not the superstrate being fabricated), rather than the distal surface 244 of the buffer layer 240 as described in a prior embodiment. As will be described below in more detail, the method allows a wider selection of materials for the different superstrate, and the contact surface of the different superstrate may have better Ra and nanotopography characteristics as compared to contact surface 482 of the superstrate 480.

The method can begin with the workpiece 200 as illustrated in FIG. 2. The workpiece can include the body 220 and buffer layer 240 as previously described.

Figure 7:
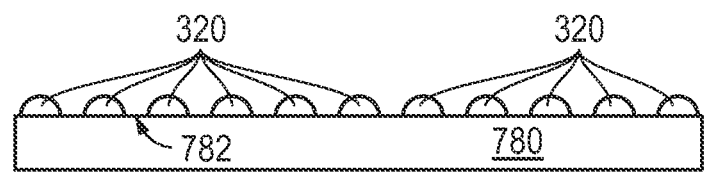
FIG. 7 includes an illustration of a cross-sectional view of a superstrate after dispensing a precursor over a contact surface of a planarizing superstrate in accordance with another implementation.

The precursor material 320 is formed along a contact surface 782 of a superstrate 780 as illustrated in FIG. 7, where the precursor material 320 can be formed using any of techniques and considerations as previously described with respect to forming the precursor material 320 along the distal surface 244 of the buffer layer 240.

The superstrate 780 can include any of the materials as previously described with respect to the superstrate 480. The superstrate 780 can have the same composition or a different composition as compared to the body 220 of the superstrate 18. In an embodiment, Ra of the contact surface 782 of the superstrate 780 can be the same or different embodiment, as compared to the surface 222 of the body 220, and in the same or different embodiment, the nanotopography of the contact surface 782 of the superstrate 780 can be the same or different embodiment, as compared to the surface 222 of the body 220.

Unlike a prior embodiment, the superstrate 780 does not have a minimum transmissibility of the curing radiation used to cure the precursor material 320. Thus, a wider variety of materials may be used for the superstrate 780 as compared to the body 220. In a particular embodiment, the superstrate 780 is a silicon wafer. As compared to synthetic fused silica, the contact surface 782 of the superstrate 780 can have lower values for Ra, nanotopography, or both Ra and nanotopography. In an embodiment, the contact surface 782 of the superstrate 780 has an Ra of 0.08 nm and a nanotopography of 3.8 nm on a 2 mm lateral scale. With aggressive control when planarizing the contact surface 782, Ra of 0.04 nm and a nanotopography of 1.7 nm on a lateral scale can be achieved.

Figure 8:
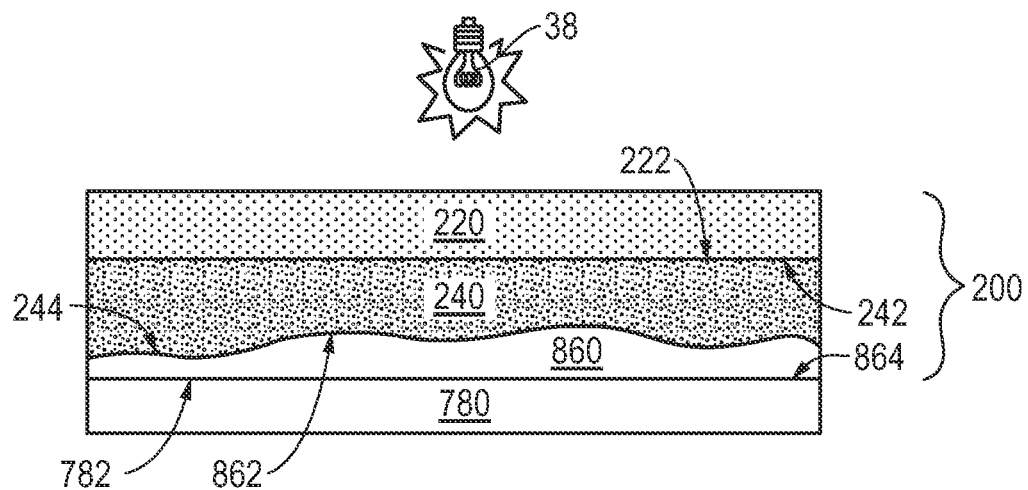
FIG. 8 includes an illustration of a cross-sectional view of the workpiece of FIG. 7 after rotating the workpiece in FIG. 2 so the buffer layer faces down, contacting the precursor with the buffer layer, and during curing of the precursor to form a compensation layer.

After forming the buffer layer 240 (FIG. 2), the workpiece 200 is rotated 180° so that the distal surface 244 of the buffer layer 240 is facing down. As the distance between the workpiece 200 and the superstrate 780 is decreased, the precursor material 320 contacts the distal surface 244 of the buffer layer 240. Droplets of the precursor material 320 coalesce to form a continuous film over the contact surface 782 of the superstrate 780. The precursor material 320 is cured by curing energy that is transmitted through the body 220 and the buffer layer 240 to form a compensation layer 860 as illustrated in FIG. 8. In an embodiment, the radiation source 38 can be used to generate radiation to cure the precursor material 320. The compensation layer 860 has a proximal surface 862 and a distal surface 864 opposite the surface 862. In an embodiment, the curing energy can be in the form of ultraviolet light. The ultraviolet light is transmitted through the body 220 and the buffer layer 240 but not through the superstrate 780. The compensation layer 860 can be a polymer, for example, a polyacrylate. The compensation layer 860 can have any of the thickness considerations and thicknesses as previously described with respect to the compensation layer 460.

The distal surface 864 of the compensation layer 860 can have substantially the same Ra, nanotopography, or both Ra and nanotopography as the contact surface 782 of the superstrate 780. In an embodiment, Ra of the distal surface 864 of the compensation layer 860 can be at most 0.20 nm or, more specifically, in a range from 0.04 nm to 0.20 nm, and in the same or different embodiment, nanotopography of the distal surface 864 of the compensation layer 860 can be at most 5.9 nm or, more specifically, in a range from 1.7 nm to 5.9 nm or 2.0 nm to 4.0 nm, all on a 2 mm lateral scale. In an embodiment, where the superstrate 780 is made of monocrystalline silicon, the distal surface 864 of the compensation layer 860 can have an Ra of nm and a nanotopography of 3.0 nm on a lateral scale. Thus, the distal surface 864 of the compensation layer 860 can have better Ra and nanotopography as compared to the distal surface 464 of the compensation layer 460, where the compensation layer 460 was formed using the superstrate 480 made of fused-silica.

After forming the compensation layer 860, the superstrate 780 is removed and the workpiece 200, including the compensation layer 860, is rotated 180° so that the surface 864 faces up. The rotation may occur before or after the superstrate 780 is removed.

Figure 9:
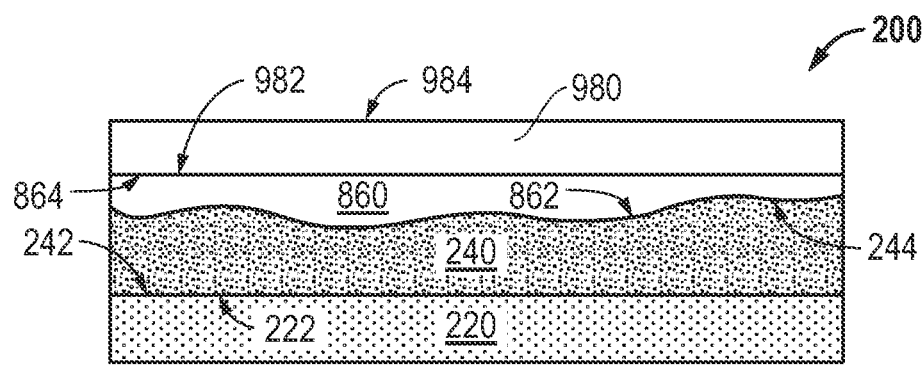
FIG. 9 includes an illustration of a cross-sectional view of the workpiece of FIG. 8 after removing the planarization superstrate, rotating the workpiece in FIG. 2 so the compensation layer faces up, and after forming a protective layer over the compensation layer.

A protective layer 980 is formed along the distal surface 864 of the compensation layer 860 as illustrated in FIG. 9. The protective layer 980 can have any of the materials and thicknesses as previously described with respect to the protective layer 680. The protective layer 980 has a proximal surface 982 and a distal surface 984 opposite the surface 982. As compared to the distal surface 684 of the protective layer 680 in FIG. 6, the distal surface 984 of protective layer 680 in FIG. 9 can have better Ra, nanotopography, or both Ra and nanotopography because the contact surface 782 of the superstrate 780 has better Ra and nanotopography as compared to the contact surface 482 of the superstrate 480.

Similar to the protective layer 680, the protective layer 980 can be treated with a release compound (not illustrated) to facilitate release of the superstrate 18 from a planarization layer formed using the superstrate 18. The release compound can include any of the previously described material with respect to the protective layer 680. The release compound does not significantly add to the thickness of the protective layer 980, for example, less than 10 nm. The release compound does not significantly affect Ra and nanotopography of the exposed surface of the superstrate 18.

The workpiece 200 at this point in the process is the substantially completed superstrate 18. The distal surface 984 of the protective layer 980 or an exposed surface of the release compound, if a release compound is used, is the contact surface for the superstrate 18. The contact surface of the superstrate 18 can have an Ra of at most 0.20 nm or, more specifically, in a range of 0.04 nm to 0.20 nm and a nanotopography of at most 5.9 nm or, more specifically, in a range of 1.7 nm to 5.9 nm or 2.0 nm to 4.0 nm, all on a 2 mm lateral scale.

In another embodiment, the precursor material 320 can be formed along the distal surface 244 of the buffer layer 240, as illustrated in FIG. 3. Referring to FIG. 4, the superstrate 480 is replaced by the superstrate 780. Unlike FIG. 4, the curing energy may be directed upward through the body 220 and the buffer layer 240, so that the curing energy is received by the precursor material 320 to form the compensation layer 860. Alternatively, after the superstrate 780 contacts the precursor material 320, the structure can be rotated 180° so that the body 220 is on the top and the superstrate 780 is on the bottom. Curing energy may be applied along the top of the structure so that the curing energy is received by the precursor material 360 to form the compensation layer 860. After curing, the superstrate 780 is separated from the compensation layer 860 of the workpiece 200. If the distal surface 864 of the compensation layer 860 is not facing upward, the workpiece 200 can be rotated, so that the distal surface 864 is facing up. The protective layer 980 is formed along the distal surface 864 of the compensation layer 860 as previously described with respect to FIG. 9. The protective layer 980 can be treated with a release compound as previously described.

FIGS. 10 to 13 illustrate a method in which the superstrate 18 can be used to form an adaptive planarization layer over a substrate. The planarization process can be integrated as part of a manufacturing method of making an article. The article can be an electric circuit element, an optical element, a microelectromechanical system (MEMS), a recording element, a sensor, a mold, or the like. An example of the electric circuit element is a semiconductor memories, such as a dynamic random access memory (DRAM), a static random access memory (SRAM), a flash memory, and a magnetoresistive memory (MRAM), a microprocessor, a microcontroller, a graphics processing unit, a digital signal processor, a field programmable gate array (FPGA) or a semiconductor element, a power transistor, a charge coupled-device (CCD), an image sensor, or the like.

Figure 10:
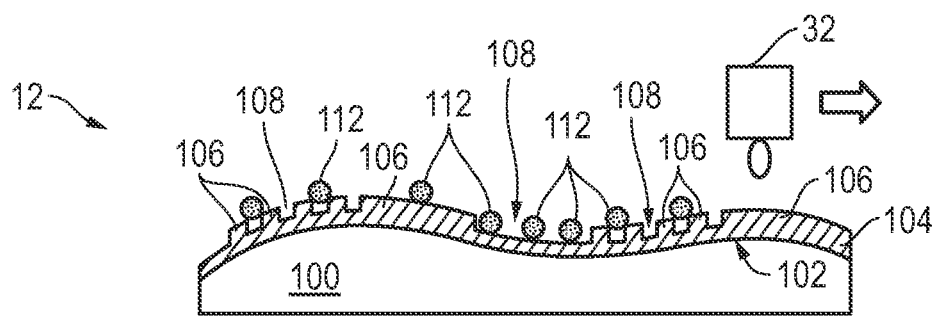
FIG. 10 includes an illustration of a cross-sectional view of a portion of a workpiece during a dispensing operation for a formable material.

The features in FIGS. 10 to 13 are exaggerated to simplify understanding. FIGS. 1 and 10 include a cross-sectional view of a formable material 112 as it dispensed from the fluid dispense system 32 onto a substrate 12 that includes a base material 100, such as a semiconductor wafer, and a patterned layer 104. The base material 100 has a surface 102 that is not perfectly flat. The patterned layer 104 overlies the surface 102 of the substrate 12. The patterned layer 104 can be a previously formed device layer or a resist layer. The patterned layer 104 can be defined using a mask, and therefore, unlike the distal surface 244 of the buffer layer 240 of the superstrate 18, the patterned layer 104 is intentionally patterned and includes protrusions 106 and recessions 108.

A subsequently-formed planarization layer will have a portion with a thickness that is significantly thicker over portions of the surface 102 that lies at lower elevations, such as recessions 108, and other portions with a thickness that is significantly thinner over other portions, such as protrusions 106 of the surface 102 that lie at higher elevations. Adaptive planarization allows a layer to be formed where the upper surface of the layer more closely matches the topology of the surface 102. A relatively lower areal density of droplets of the formable material 112 are dispensed over the protrusions 106, and a relatively higher areal density of droplets of the formable material 112 are dispensed in the recessions 108.

Figure 11:
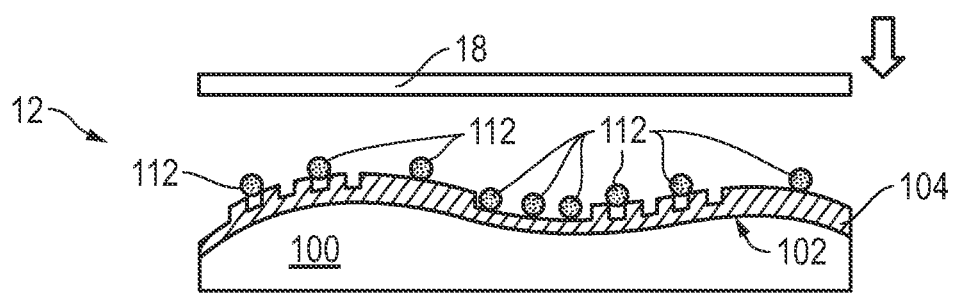
FIG. 11 includes an illustration of a cross-sectional view of the workpiece of FIG. 10 during a planarization operation using a superstrate.

Referring to FIGS. 1 and 11, the superstrate 18 is brought into contact with the formable material 112. The superstrate 18 can have any of the physical designs and formed by a method previously described. When the superstrate 18 contacts the formable material 112, the formable material 112 spreads and fills the space between the superstrate 18 and the patterned layer 104.

Figure 12:
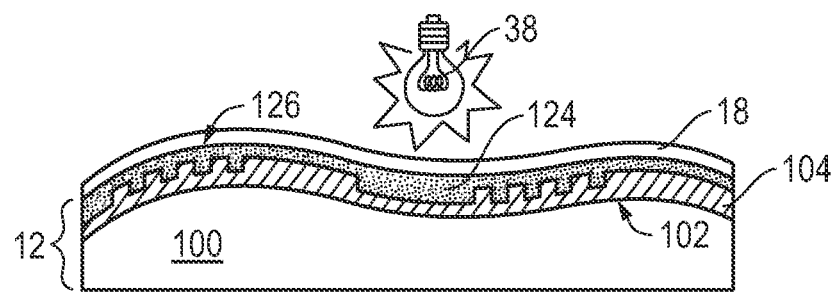
FIG. 12 includes an illustration of a cross-sectional view of the workpiece of FIG. 11 during exposure of the formable material to actinic radiation.
Figure 13:
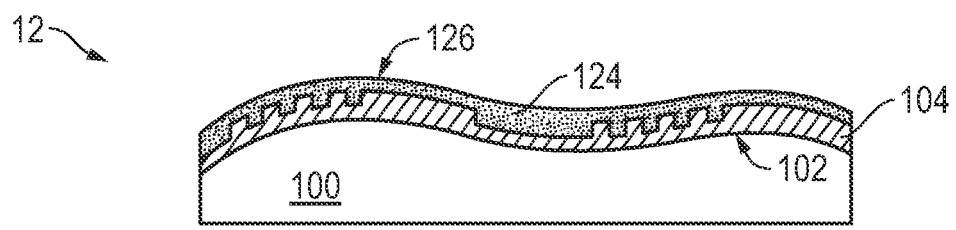
FIG. 13 includes an illustration of a cross-sectional view of the workpiece of FIG. 12 after the superstrate is removed.

Referring to FIGS. 1 and 12, the formable material 112 is cured using the energy source 38 to form the planarization layer 124. After the planarization layer 124 is formed, the superstrate 18 is separated from the planarization layer 124 as illustrated in FIG. 13.

The distal surface 126 of the planarization layer 124 can have substantially the same Ra, nanotopography, or both Ra and nanotopography as the contact surface of the superstrate 18. Referring to FIGS. 6 and 9, the Ra and nanotopography along the distal surface 684 of the protective layer 680 (FIG. 6) and the distal surface 984 of the protective layer 980 (FIG. 9) are very good because the distal surface 464 of the compensation layer 460 (FIG. 6) and the distal surface 864 of the compensation layer 860 (FIG. 9) have significantly better Ra, nanotopography, or both Ra and nanotopography as compared to a superstrate that includes the buffer layer 240 and a protective layer but without a compensation layer.

Embodiments as described herein are useful in forming a superstrate having a smoother and more planar contact surface as compared to a conventional superstrate. A compensation layer can be formed such that it has substantially the same surface roughness and nanotopography of a contact surface of another superstrate used in forming the compensation layer. Thus, the compensation layer can help to reduce the issues with the relatively poor surface roughness and nanotopography of a distal surface of the buffer layer. A protective layer can be formed over the distal surface of the compensation layer. The distal surface of the protective layer can be the contact surface for the superstrate being fabricated. Therefore, the contact surface of the superstrate can have the same or better surface roughness and nanotopography as compared to a surface of the body of the superstrate.

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. A superstrate, comprising:
a body of the superstrate, wherein the body has an upper surface that does not have recessions and protrusions;

a first buffer layer overlying the body and having a proximal surface and a distal surface opposite the proximal surface, wherein the body is closer to the proximal surface of the first buffer layer than to the distal surface of the first buffer layer, and the first buffer layer includes an organic compound;

a second compensation layer overlying the first buffer layer to fill any elevation changes along the distal surface thereof and having a proximal surface and a distal surface opposite the proximal surface, wherein the body is closer to the proximal surface of the second compensation layer than to the distal surface of the second compensation layer; and a third protection layer overlying the second compensation layer and having a proximal surface and a distal surface opposite the proximal surface, wherein the body is closer to the proximal surface of the third protection layer than to the distal surface of the third protection layer, wherein an Ra of the distal surface of the first buffer layer is greater than an Ra of each of the upper surface of the body, the distal surface of the second compensation layer, and the distal surface of the third protection layer, wherein the Ra is an arithmetic average surface roughness.

2. The superstrate of claim 1, wherein along the distal surface of the first buffer layer, the first buffer layer does not have an intentional pattern of recessions and protrusions.

3. The superstrate of claim 1, wherein the Ra of the distal surface of the second compensation layer is at most 0.20 nm.

4. The superstrate of claim 3, wherein:
the proximal surface of the first buffer layer is along the upper surface of the body, and the Ra of the upper surface of the body is at most 0.2 nm,
the proximal surface of the second compensation layer is along the distal surface of the first buffer layer, and
the proximal surface of the third protection layer is along the distal surface of the second compensation layer, and the Ra of the distal surface of the third protection layer is at most 0.2 nm.

5. The superstrate of claim 1, wherein a nanotopography of the distal surface of the third protection layer is less than a nanotopography of the distal surface of the first buffer layer.

6. The superstrate of claim 5, wherein a nanotopography of the distal surface of the third protection layer is at most 5.9 nm on a 2 mm lateral scale.

7. The superstrate of claim 1, wherein the first buffer layer comprises an acrylic polymer.

8. The superstrate of claim 7, wherein the second compensation layer comprises a polymerizable compound.

9. The superstrate of claim 7, wherein the second compensation layer comprises a polyacrylate.

10. The superstrate of claim 1, wherein:
the first buffer layer is formed by thermally curing a first precursor, and
the second compensation layer is formed curing a second precursor, wherein curing is performed using actinic radiation having a wavelength in a range from 10 nm to 1000 nm.

11. The superstrate of claim 1, wherein the third protection layer comprises an oxide, a nitride, an oxynitride, or a fluoropolymer.

12. A method of making a first superstrate, comprising:
forming a first buffer layer along a surface of an upper surface of a body of the first superstrate, wherein the upper surface does not have recessions and protrusions, the first buffer layer has a proximal surface and a distal surface opposite the proximal surface, and the body is closer to the proximal surface of the first buffer layer than to the distal surface of first buffer layer; and forming a second compensation layer along the distal surface of the first buffer layer to fill any elevation changes along the distal surface thereof, wherein the second compensation layer has a proximal surface and a distal surface opposite the proximal surface, and the body is closer to the proximal surface of the second compensation layer than to the distal surface of second compensation layer; and forming a third protection layer along the distal surface of the second compensation layer, wherein the third protection layer has a proximal surface and a distal surface opposite the proximal surface, and the body is closer to the proximal surface of the third protection layer than to the distal surface of third protection layer, wherein after forming the third protection layer, an Ra of the distal surface of the first buffer layer is greater than an Ra of each of the upper surface of the body, the distal surface of the second compensation layer, and the distal surface of the third protection layer, wherein the Ra is an arithmetic average surface roughness.

13. The method of claim 12, wherein forming the first buffer layer comprises:
depositing a precursor for the first buffer layer along the surface of the body, wherein the precursor has an exposed surface opposite the body; and
curing the precursor using curing energy to form the first buffer layer, wherein during curing, a solid object is not in contact with the exposed surface of the precursor.

14. The method of claim 12, wherein forming the first buffer layer comprises:
depositing a precursor for the first buffer layer along the surface of the body; and
curing the precursor using curing energy to form the first buffer layer, wherein during curing, the precursor is not uniformly exposed to the curing energy.

15. The method of claim 12, wherein forming the second compensation layer comprises:
depositing droplets of a precursor for the second compensation layer;
contacting the precursor with a second superstrate; and
curing the precursor to form the second compensation layer, wherein the second superstrate contacts the precursor during curing.

16. The method of claim 12, wherein forming the third protection layer comprises:
depositing a precursor for the third protection layer along a surface of a second superstrate;
contacting the precursor with the second compensation layer; and
curing the precursor to form the third protection layer, wherein the second superstrate contacts the precursor during curing.

17. The method of claim 12, wherein the Ra of the distal surface of the third protection layer is at most 0.20 nm.

18. The method of claim 16, wherein the first superstrate has an ultraviolet transmittance of at least 70%, and the second superstrate is a silicon wafer.

19. A method of making an article, comprising:
dispensing a formable material over a patterned layer of a workpiece, wherein the workpiece includes a substrate and the patterned layer overlies the substrate;
contacting the formable material with the superstrate of claim 1;

exposing the formable material to actinic radiation to form a planarization layer while the distal surface of the third protection layer of the superstrate is in contact with the formable material to form the planarization layer; and processing the workpiece to complete formation of the article.

20. The method of claim 19, wherein:

the proximal surface of the first buffer layer is along the upper surface of the body, and the Ra of the upper surface of the body is at most 0.2 nm, the proximal surface of the second compensation layer is along the distal surface of the first buffer layer, and the proximal surface of the third protection layer is along the distal surface of the second compensation layer, and the Ra of the distal surface of the third protection layer is at most 0.2 nm.

* * * * *